(12) United States Patent
Sato et al.

(10) Patent No.: US 6,440,644 B1
(45) Date of Patent: Aug. 27, 2002

(54) PLANARIZATION METHOD AND SYSTEM USING VARIABLE EXPOSURE

(75) Inventors: Takashi Sato, Kanagawa (JP); Katsuya Okumura, Poughkeepsie; Junichiro Iba, Wappingers Falls, both of NY (US)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/438,061

(22) Filed: Nov. 10, 1999

Related U.S. Application Data

(62) Division of application No. 08/950,434, filed on Oct. 15, 1997, now Pat. No. 6,064,466.

(51) Int. Cl.[7] .................................................. G03C 5/00
(52) U.S. Cl. ...................... 430/322; 430/311; 430/396; 430/313; 216/38; 438/760
(58) Field of Search ................................. 430/311, 322, 430/396, 313; 216/38; 438/760

(56) References Cited

U.S. PATENT DOCUMENTS

| | | | |
|---|---|---|---|
| 4,549,843 A | 10/1985 | Jagusch et al. | 118/504 |
| 4,655,874 A | 4/1987 | Marks | 156/643 |
| 4,676,868 A | 6/1987 | Riley et al. | 156/643 |
| 4,764,483 A | 8/1988 | Fuse et al. | 437/67 |
| 4,824,802 A | 4/1989 | Brown et al. | 437/192 |
| 4,865,952 A | 9/1989 | Yoshioka et al. | 430/315 |
| 4,902,899 A | 2/1990 | Lin et al. | 250/492.1 |
| 4,952,274 A | 8/1990 | Abraham | 156/643 |
| 5,004,673 A * | 4/1991 | Vlannes | 430/325 |
| 5,077,234 A | 12/1991 | Scoopo et al. | 437/67 |
| 5,110,410 A | 5/1992 | Elkind | 156/643 |
| 5,139,608 A | 8/1992 | Grivna | 156/643 |
| 5,175,122 A | 12/1992 | Wang et al. | 437/67 |
| 5,286,581 A | 2/1994 | Lee | 430/5 |
| 5,296,092 A | 3/1994 | Kim | 156/643 |
| 5,310,621 A | 5/1994 | Sayka | 430/311 |
| 5,350,486 A | 9/1994 | Huang | 156/633 |
| 5,362,591 A | 11/1994 | Imai et al. | 430/5 |
| 5,418,093 A | 5/1995 | Asai et al. | 430/311 |

OTHER PUBLICATIONS

W.S. Han, et al., The Japan Society of Applied Physics and Related Societies, "Method of Overcoming Global Topography with Transmittance Controlled Mask" Samsung Electronics Co., Ltd., Semiconductor R&D Center, Extended Abstracts (The 41st Spring Meeting, 1994).

Timothy A. Brunner, The International Society for Optical Engineering (SPIE); "Optical/Laser Microlithography VII" vol. 2197, pp. 140–148, Mar. 1994.

\* cited by examiner

Primary Examiner—Mark F. Huff
Assistant Examiner—Daborah Chacko-Davis
(74) Attorney, Agent, or Firm—Banner & Witcoff, Ltd.

(57) ABSTRACT

A method and system for planarization is disclosed. The system includes a mask including a medium density, sub-resolution region which allows less than the full intensity of the exposing radiation through to a resist layer. By including multiple density regions, improved planarization can be achieved.

14 Claims, 6 Drawing Sheets

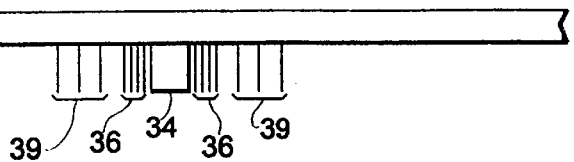
FIG. 6(a)
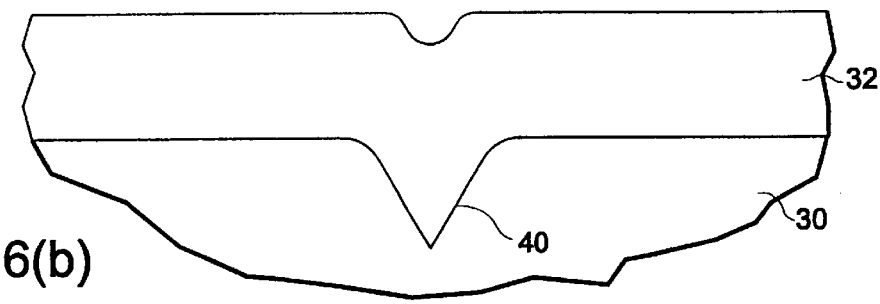
FIG. 6(b)
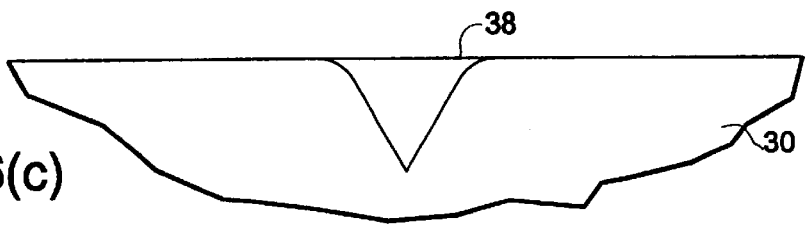
FIG. 6(c)
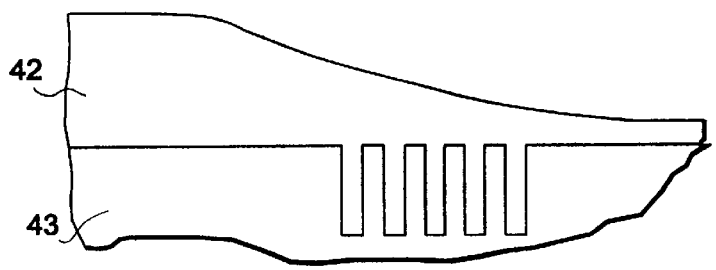
FIG. 7(a)
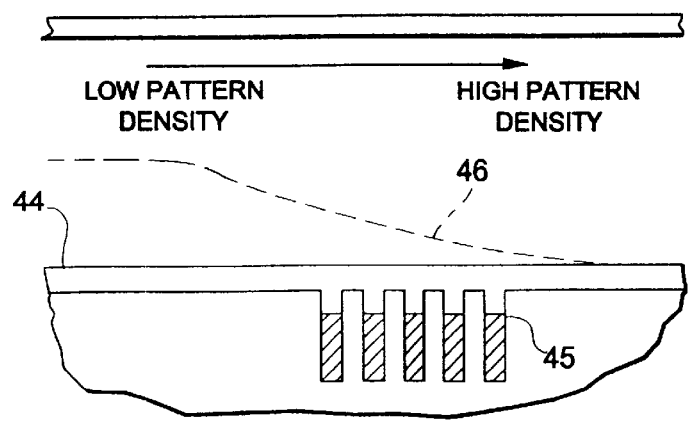
FIG. 7(b)
FIG. 7(c)

PLANARIZATION METHOD AND SYSTEM USING VARIABLE EXPOSURE

This is a division of application Ser. No. 08/950,434, filed on Oct. 15, 1997, and is now U.S. Pat. No. 6,064,466, issued on May 16, 2000.

FIELD OF THE INVENTION

The following invention relates to planarizing a semiconductor surface for subsequent processing.

BACKGROUND OF THE INVENTION

A semiconductor integrated circuit includes multiple layers of various materials. One important consideration in creating a semiconductor integrated circuit is aligning all layers so that patterns match and accurate alignment is achieved. Alignment becomes even more critical as the features on a wafer are minimized. As features shrink in size, any misalignment or variation in processing which might have been acceptable for a larger element might lead to the failure of the smaller element. It is sometimes desirable that a layer be smooth in order, for example, to ensure uniform coverage of a subsequently formed layer. One way of smoothing a layer includes heating the applied layer near its melting point so that the layer begins to flow. This works well, for example, with a phosphorus-doped silicon dioxide layer when heated to temperatures above 800° C. However, when the highest allowable substrate temperature is less than the silicon dioxide flow temperature, heating and flowing as described would destroy the substrate.

An alternative technique exists which can be used to smooth the semiconductor surface. FIGS. 1, 2A, and 2B show the process known as planarization. FIG. 1 shows a substrate with a poly-silicon feature 101. coating feature 101 is phosphorus-doped silicon dioxide (commonly known as P-glass) 102. FIGS. 2A and 2B show how a known planarization process functions. To planarize the abrupt steps found in layer 102, a resist layer 103 coats the surface of the P-glass as shown in FIG. 2A. The resist is etched away. During the etching process, the P-glass layer 102 is etched as well, converting the sharp steps into smoother shapes. This process, however, has the drawbacks of not adequately planarizing the surface. If one was to repeat the above process, the resulting surface level would be flatter, however more processing steps would be required.

SUMMARY OF THE INVENTION

The invention is based on the relationship between sub-resolution pattern density and resist thickness. A high pattern density minimizes the radiation that passes through a pattern mask. As pattern density increases, less actinic light is allowed through. In the case of positive resists, less light means fewer bonds are broken. After development, less resist is stripped away, yielding a greater resist thickness. The current system includes a multiple density portion pattern mask which is placed over a resist-coated substrate. The resist is exposed and processed. The resist is removed and an improved planarization state is achieved. The invention has been described with respect to using positive resists. It is equally adaptable for use with negative resists. Uses for the system and method disclosed include forming buried-strap layers and trench capacitors.

BRIEF DESCRIPTION OF THE DRAWINGS

FIGS. 6A–C show an alternative version of the mask of FIGS. 5A–D including variable density portions.

FIGS. 7A–C show resist processing of resist overlying multiple trenches.

DETAILED DESCRIPTION

The description of the present invention will be described with reference to a substrate, a feature on or in the substrate and a resist layer coating the surface of the substrate. In order to provide a flat work surface for subsequent processing, the resist layer is planarized before any etching of the resist or underlying layers.

Figure 1:
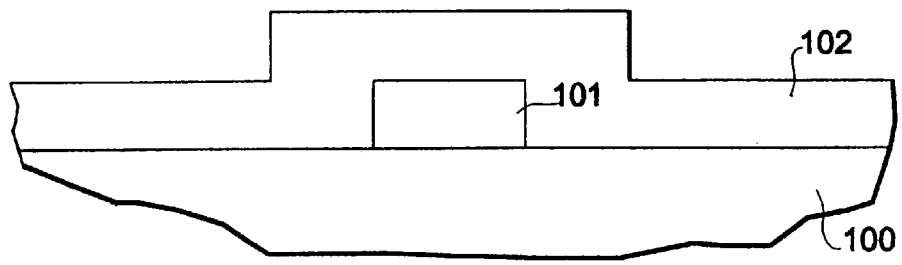
FIGS. 1, 2A and 2B show a method used in the prior art to planarize a semiconductor surface.
Figure 2A:
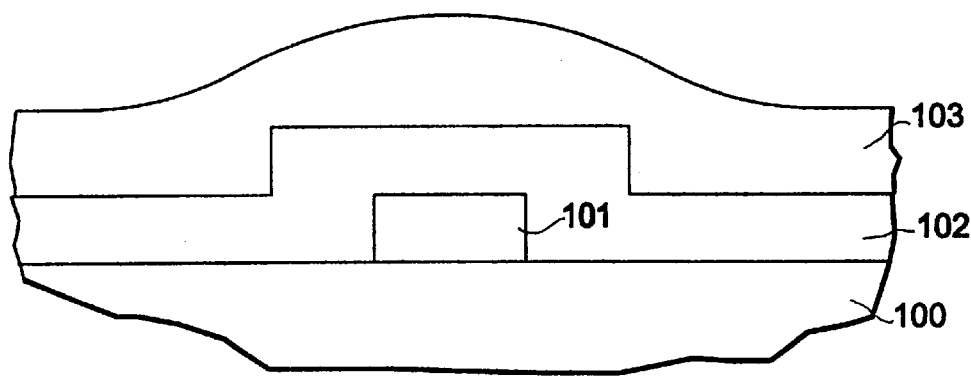

One of the problems with prior planarization methods, as shown in FIG. 2A, was that the resist coating a feature was not planar across the surface of the substrate. The prior art resists would follow the contour of the underlying layer. As the planarization technique of FIGS. 1, 2A, and 2B fails to adequately flatten the resist layer, the resulting hills and valleys make subsequent processing difficult as these hills and valleys affect the deposition of subsequently applied layers. On a related point, the resulting work surface is not flat.

In addition to coating and etching for planarization purposes, resists are used for lithography purposes as well. Here, resists, through patterning, allow selective exposure and shielding to layers on a semiconductor wafer. Patterning includes exposure and developing of the resist layer. When exposed to radiation (optical or electron, x-ray, and ion, depending on the resist used) the molecular bonds in the resist link and break. When developed, the linked molecular bonds remain on the surface of the semiconductor wafer and the un-linked molecules are removed.

Resists fall into two basic types: positive resists and negative resists. When positive resists are exposed, the rate of bond breakage exceeds the rate of bond linkage. On the other hand, when negative resists are exposed, the rate of bond linkage exceeds the rate of bond breakage.

Figure 3A:
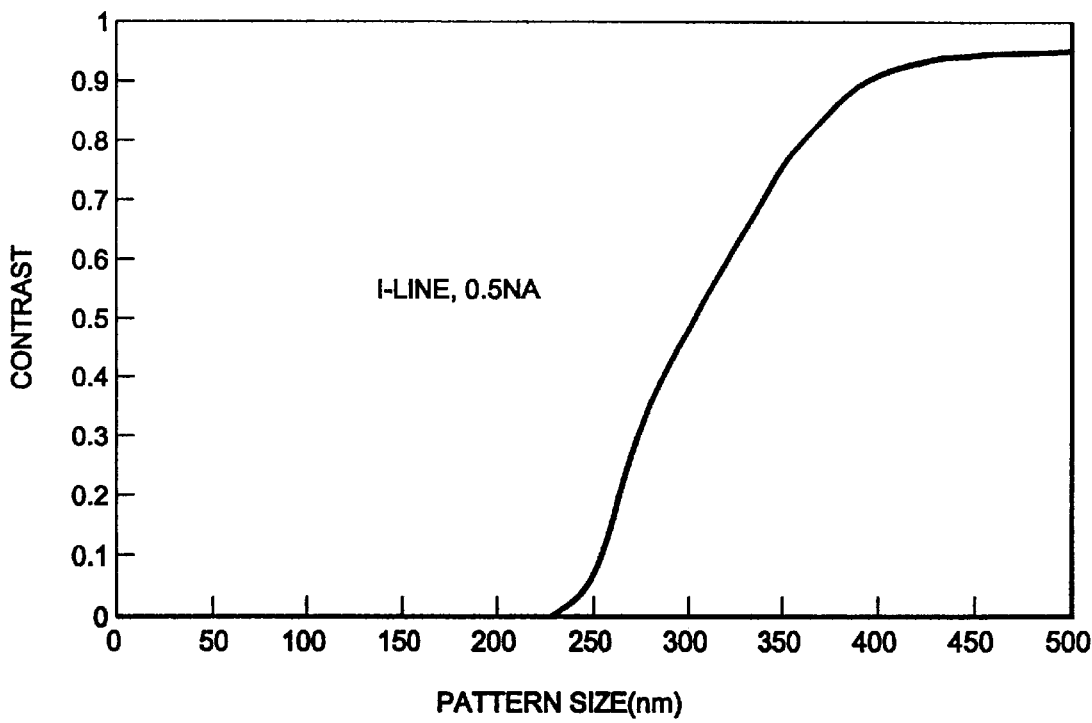
FIGS. 3A–B show the relationship between pattern density and resist thickness.

The relationship between pattern density and resist thickness is used to further planarize the resist coating. FIG. 3A discloses this relationship. FIG. 3A illustrates an aerial image using an i-line stepper of 0.5 NA (numerical aperture). At a pattern of 250nm L/S (lines and spaces), the contrast is effectively zero. While no patterns result, some light reaches the wafer. The quantity of light leaked to the wafer is correlated to the duty ratio of the lines to spaces in the applied pattern (from the pattern mask).

Figure 2B:
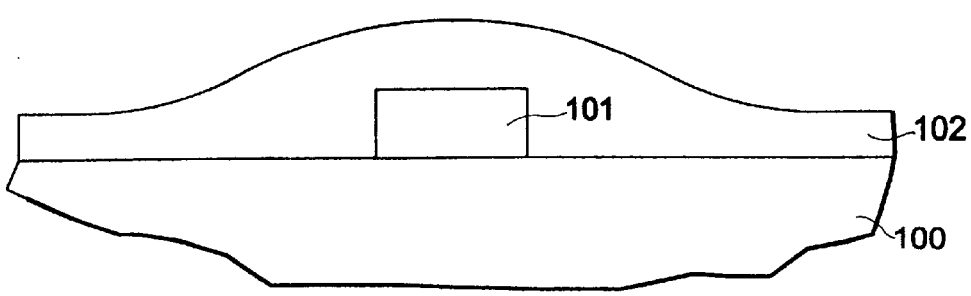
Figure 3B:
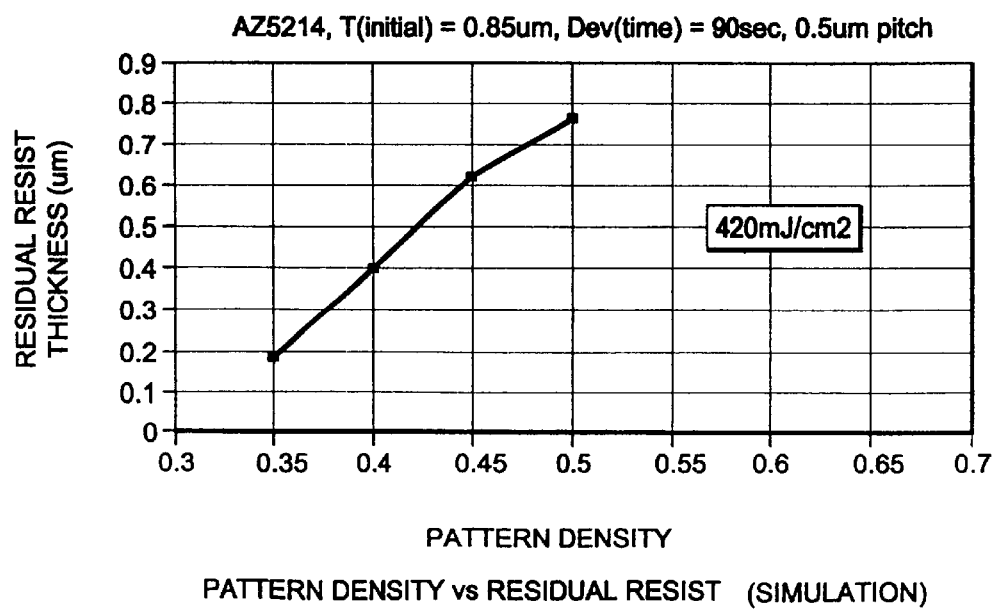

In the case of positive resists, as pattern density increases, less actinic light passes through the mask. If one were to observe the intensity of light falling on the wafer under a dense pattern, the light would appear as dark grey. Likewise, if one were to observe the intensity of light falling on the wafer under a light pattern, the light would appear as light grey. Less light means less bond breakage in the positive resist. Less bond breakage means less resist is stripped away during development. Thus, Applicants have found that by adjusting the light passing through a pattern mask, the resist layer over protrusions and trenches can be finely adjusted. FIG. 3B illustrates the correlation between pattern density (ratio of the area occupied by a line of line and space pattern) and residual resist thickness post-development. It should be noted that the value shown for the residual resist thickness depends on the light intensity, the pattern density, development time, and the type of resist used. In this example, the resist used is AZ5214 manufactured by Hoechst. The initial resist thickness (T(initial)) is 0.85 um, the development time of the resist (Dev(time)) is 90 seconds, and the light intensity is 420 mJ/cm$_2$. This adjustment yields planarization not realized before with the resist planarization techniques as shown in FIGS. 1, 2A, and 2B.

Figure 4A:
FIGS. 4A–E shows the various steps using a multiple density mask to planarize the surface of a substrate.
Figure 4B:
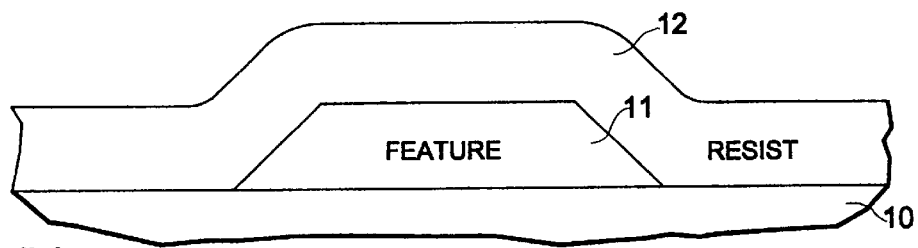
Figure 4C:
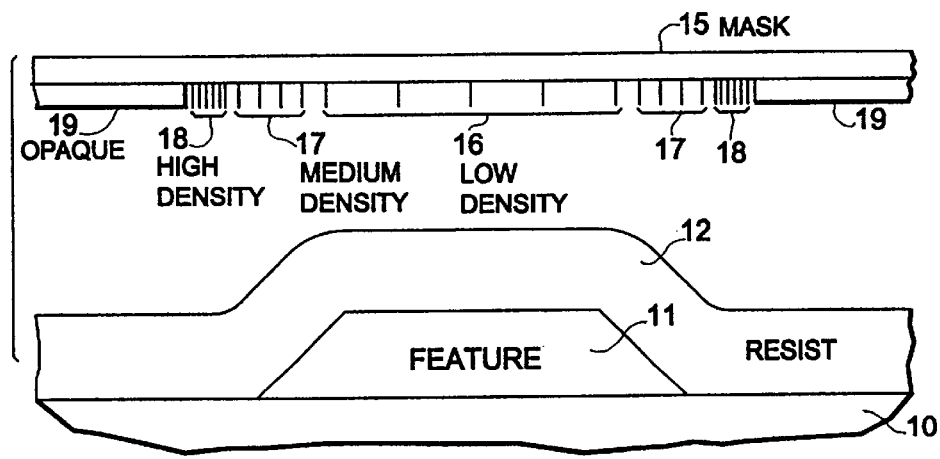
Figure 4D:
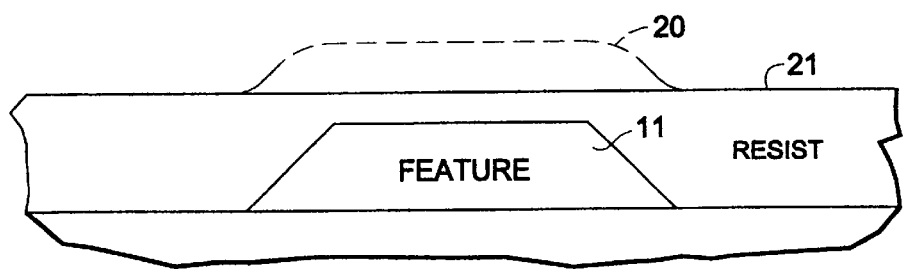
Figure 4E:
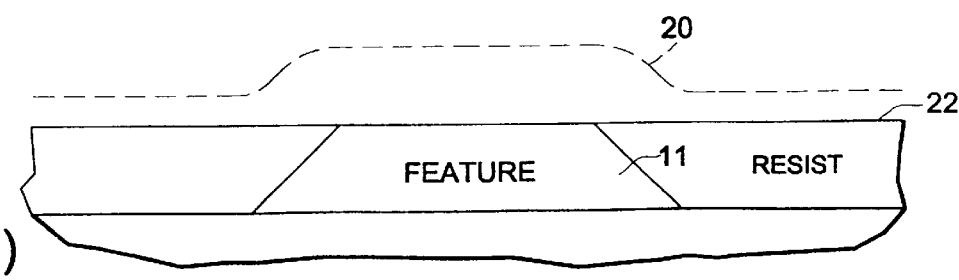

FIGS. 4A–E show the resist-exposure relationship applied toward planarizing the resist layer coating a feature protruding from a semiconductor substrate. FIG. 4A shows a substrate 10 with a feature 11. The semiconductor substrate 10 is coated with a layer of resist 12 which also covers feature 11 (see FIG. 4B). For example, this resist layer may be 0.83 microns thick. In that the resist layer is generally uniform in thickness, the bulge of the feature 11 shows through the resist layer 12. A mask 15 with at least three different light transmittance portions (16, 17, and 18) is aligned with the feature (see FIG. 4C). A radiation source (not shown) exposes the resist layer 12 through the mask 15. The exposed resist is developed and the exposed portions are removed (see FIG. 4D). Interim baking may be used. Depending on the resist used, the baking temperature (for example, 150° C.) and duration may vary. In that the mask allows less than the full intensity radiation to fall upon some regions of the resist layer, these regions maintain more cross-linking bonds than the regions exposed to the full intensity radiation. Accordingly, less resist is removed from these regions exposed to less than the full intensity radiation than the regions exposed with the full intensity light. Because the regions allowing less than the full intensity light to pass through (medium density 17 and high density 18) are aligned over the sloped sidewalls of the feature and resist exposed, the amount of bonds broken in the resist over the sidewalls is less than the amount of bonds broken in the resist over feature 11. This exposure difference is because of the differences between the radiation passing through low density portion 16, medium density portions 17, high density portions 18 and opaque portions 19. Accordingly, less resist is removed from the sidewalls of the feature and planar areas of the substrate 10. The variation in the amount of light passing through the mask with its variable density portions can be referred to as the transmission or transmittance of the mask. With the medium density and high density regions 17 and 18 arranged above the sidewalls, the slope of the sidewalls can be matched by the variation in the transmittance of the grouping of the different partial transmittance portions (16, 17, and 18). Referring to FIG. 4D, after development, the amount of resist over the substrate is minimally reduced, the amount of resist over the sidewalls is reduced more, and the amount of resist over the feature 11 is reduced even more as shown by dashed line 20. Dashed line 20 refers to the original resist thickness. The difference between the dashed line 20 and new surface 21 of the resist layer 12 shows the amount of resist removed during the development process. Additionally, FIG. 4E shows the resist layer 12 with more exposure and more resist removed as shown by the difference between original resist layer 20 and the new resist surface 22. After development, the surfaced of the resist 22 over the feature 11 and that over the substrate 10 are equalized. Further, the coating, exposing, and developing steps may be repeated to. further planarize the surface of the wafer. Thus, improved planarization is achieved.

Figure 5A:
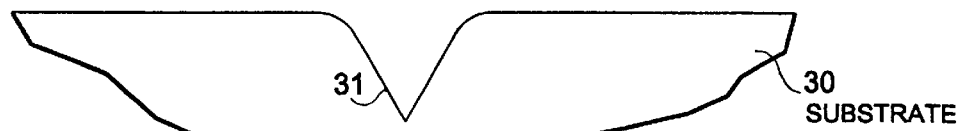
FIGS. 5A–D shows the steps involved in planarizing a single pit.
Figure 5B:
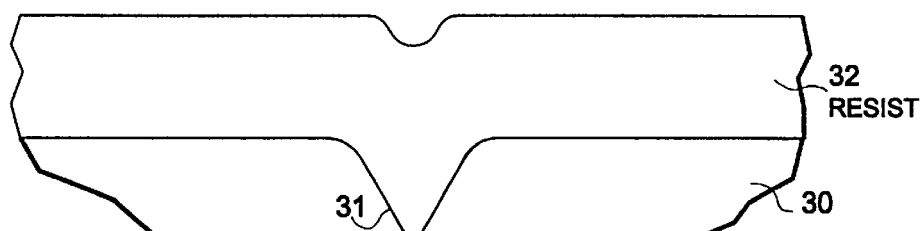
Figure 5C:
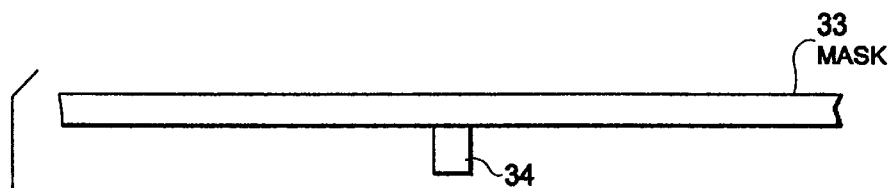
Figure 5C:
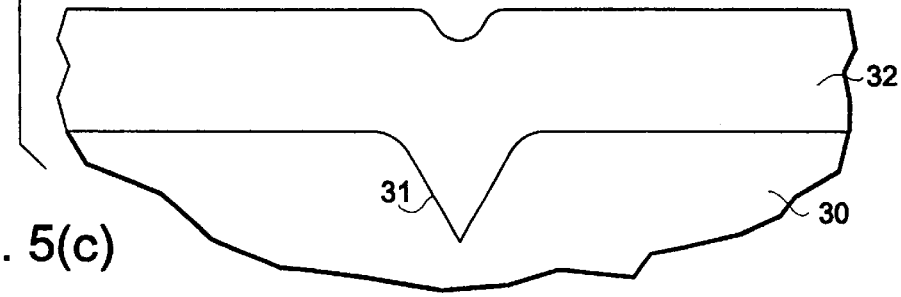
Figure 5D:
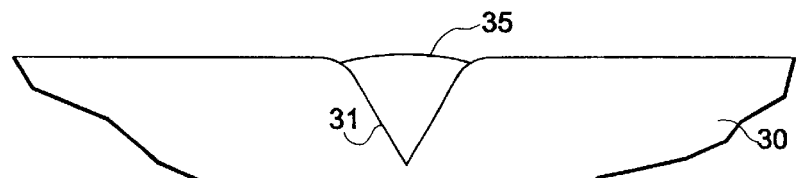

FIGS. 5A–D show how a narrow pit or indentation can be planarized to the surface level of the surrounding layer. FIG. 5A shows a substrate 30 with a pit 31. FIG. 5B shows resist 32 applied over the substrate 30 and pit 31. Because the resist layer 32 flows into pit 31, the shape of the pit 31 is reflected in the surface of the resist 32. For this example, positive resist is employed. As shown in FIG. 5C, the disclosed system uses a mask 33 with a non-transmittance portion 34 aligned over the narrow pit. Uniform exposure to the resist over the flat portion of the semiconductor layer and subsequent development reduces the amount of resist 32 remaining over this portion after development. By not exposing the resist in the pit 31, the pit retains some portion of the resist 35. Accordingly, after exposure and development the surface level of the resist in the pit matches the surface level of the resist on either side of the pit. Furthermore, by varying the exposure time and mask transmittance, the surface level of the resist remaining in the pit after development can be equalized with the surrounding semiconductor layer. Thus, the above system achieves a finer degree of planarization. The above process and corresponding system can be readily modified to use negative resists by one of ordinary skill in the art.

FIGS. 6A–C show a mask and a related trench 40 being filed in with resist. The mask of FIG. 6A includes not only a simple, opaque portion 34 but also intermediate transmittance portions as well. Portion 36 refers to a medium density sub-resolution pattern and portion 39 refers to a low-density sub-resolution pattern. The arrangement of these variable density radiation transmitting portions (36 and 39) accounts for any slope in the sidewall of the trench 40. For example, at least one partial transmittance portion 36 can be arranged next to the opaque portion 34. With this single example, the partial transmittance portion 36 approximates the slope of the sides of trench 40. When exposed, the portion of the resist 32 overlying the sidewall portions of trench 40 is exposed to some of the exposing radiation, notably more than the portion of the resist located in the middle of trench 40. After development, a greater amount of resist 38 remains on the sidewalls of the trench than on the fully exposed non-trenched regions, though less resist than that remaining in the deepest portion of the trench. Accordingly, the resulting surface of the resist 38 remaining in the trench 31 may be adjusted (by means of adjusting portions 34, 36, and 39 of the mask) to be co-planar with the surface of substrate 30. The partial transmittance portions 16–18 (from FIG. 4), 36 and 39 may be varied in number and/or transmittance as needed with each new feature found on the semiconductor surface. The filling of the trench as shown in FIGS. 5 and 6 can be simply reversed to allow for use with negative resists.

In comparison to pit 31 of FIG. 5A–5D, pit 40 is wider than pit 31. While substrate 30 of FIGS. 5A–D is planarized by using mask 33 with opaque portion 34, substrate 30 of FIG. 6A–C is planarized by using a mask with multiple portions 34, 36, and 39 with different actinic light transmittances. The option to use a single opaque portion 34 as shown in FIGS. 5A–D or to use multiple portions 34, 36, and 39 depends on the size of the pit or trench to be filled and the degree of planarization required.

Referring to FIG. 7, the semiconductor wafer 43 includes multiple trenches 41. These trenches may be used, for example, in the formation of trench capacitors. When coated, the resist 42 flows into the trenches 41. While the thickness of the resist may be at the desired thickness above the trenches, the resist layer is not planar. To planarize the wafer including the deep trenches, a variable transmittance mask is used as shown in FIG. 7B. In the case of positive resists, the resist overlying the trenches is exposed to less radiation then the resist overlying the non-trenched region. The mask portion above the thickest portion of the resist has the highest light transmittance. Likewise, the mask portion above the thinnest portion of the resist (the resist overlying the trenched region) has the lowest light transmittance. This equates to a low pattern density over the non-trenched region and a high pattern density over the trenched region. Furthermore, the increase in thickness across the surface of the wafer is mirrored in the change in transmittance of the exposing mask. After exposure and development, the remaining resist layer 44 is flat as shown in FIG. 7C.

The above process can be employed to further reduce the resist layer in each trench to a level below that of the surface of the substrate (as shown by the levels 45 in trenches 41). This reduction is performed by exposing the resist layer as set forth above for a longer period of time. Alternatively, the mask transmittance pattern can be altered to produce the same results. That means the mask's transmittance should be altered allowing more radiation to fall upon the resist located in the deep-trenches. Accordingly, more resist molecules in the trenches are exposed and bonds broken. When developed, the resist layer in the trenches is reduced. Thus, improved planarization is achieved. The same procedure can be used with negative resists by inverting the mask's transmittance.

Reducing the level of the resist to levels 44 and/or 45 prepares the substrate for the next level of processing. For example, with a lower resist level as shown by level 45, the next step may include forming a storage node for a DRAM cell.

Figure 8:
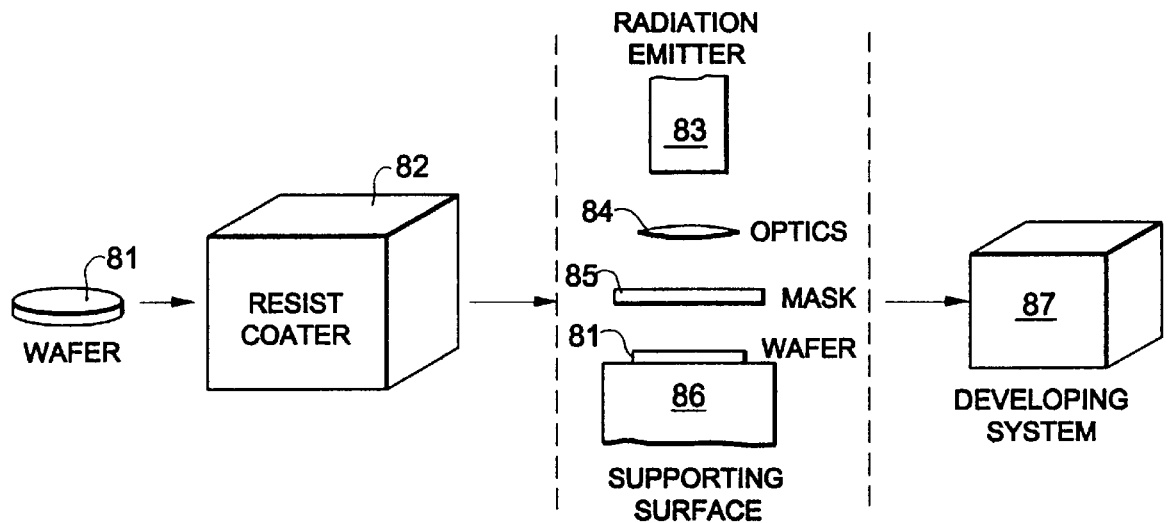
FIG. 8 shows items used in resist processing to practice the invention.

FIG. 8 shows a wafer 81 passing to a resist coater 82 where it receives a layer of resist. Next, the wafer 81 is exposed in an exposing system as shown by the broken line 89. The exposing system includes a radiation emitter emitting optical, electron, x-ray, or ion radiation. The emitted radiation is adjusted by optics 84 and directed through variable density mask 85. The radiation then falls upon wafer 81 supported by surface 86 where the resist coating the wafer is exposed. Finally, the wafer with the selectively exposed resist is passed to developing system 87 where portions of the resist layer are removed.

Figure 9:
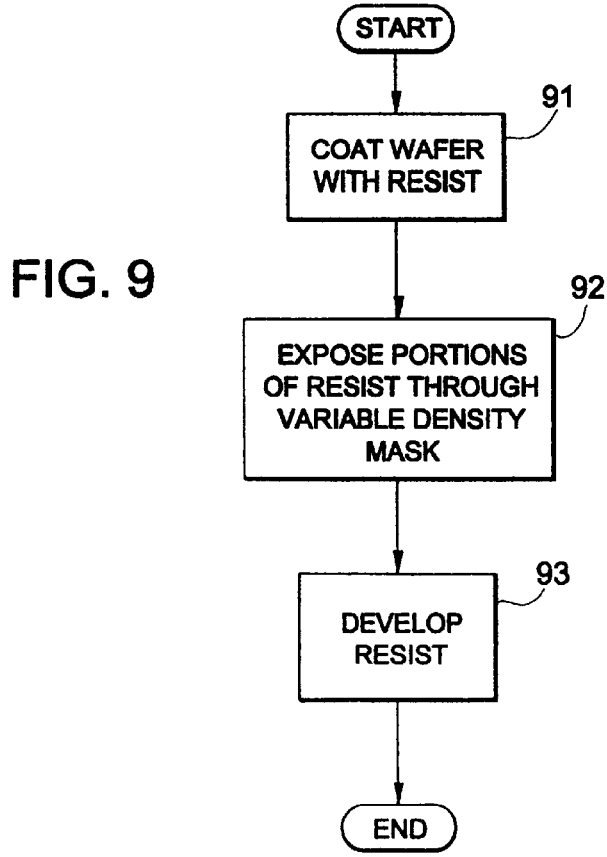
FIG. 9 shows a flow chart relating to the steps involved in resist processing relating to the invention.

FIG. 9 shows the steps used in creating a patterned resist layer. A received wafer is coated with a layer of resist in Step 91. The coated wafer is selectively exposed by radiation passing through a variable density mask as shown in Step 92. Finally, portions of the resist are removed in Step 93. The portions of the resist removed correspond to the portions of the resist lacking cross-linked bonds (either created or destroyed during the exposure step 92). Through this process, the semiconductor wafer receives a planar resist layer.

Although the invention has been described with respect to a preferred embodiment, it will be appreciated that various alterations and arrangement of parts may be made without departing from the spirit and scope of the invention, as defined by the following claims.

We claim:

1. A process for planarizing a contoured topographic surface of a semiconductor wafer comprising the steps of:
    applying a resist to said contoured topographic surface, said resist having a topographical contour substantially matching the contour of said contoured topographic surface;
    exposing selected portions of said resist on said contoured topographic surface to radiation through a variable density pattern mask, said variable density pattern mask having a plurality of densities relating to said topographical contour of said resist; and
    developing said resist and leaving a developed resist layer with a substantially planar surface.

2. The process according to claim 1, wherein said resist topographical contour has hills and valleys, said resist is a positive resist, and during the step of exposing, less dense ones of said plurality of densities are aligned with said hills and more dense ones of said plurality of densities are aligned with said valleys.

3. The process according to claim 1, wherein said resist topographical contour has hills and valleys, said resist is a negative resist, and during the step of exposing, more dense ones of said plurality of densities are aligned with said hills and less dense ones of said plurality of densities are aligned with said valleys.

4. A process for planarizing a surface of a semiconductor wafer which includes at least one feature and a uniform thickness resist layer coating said surface, said resist layer coating having a contoured topography in response to coating said at least one feature on said wafer, said process including the step of:
    exposing said resist through a mask having patterns relating to said contoured topography and said at least one feature, so that when developed the resist layer varies in thickness so as to compensate for a topography of said at least one feature, leaving a developed resist layer with a substantially planar surface.

5. The process according to claim 4, wherein said resist is a positive resist, and said mask patterns are proportionally related to said contoured topography and said at least one feature.

6. The process according to claim 4, wherein said resist is a negative resist, and said mask patterns are inversely related to said contoured topography and said at least one feature.

7. A process for planarizing a surface of a semiconductor wafer which includes a first region with multiple deep trenches and a second region apart from said first region, said wafer including a coated resist layer whose thickness is greater over said second region than over said first region, said process including the step of:
    exposing said first region with radiation of a first intensity and exposing said second region with radiation of a second intensity through a variable density pattern mask, said first intensity being related to said thickness of the resist layer in said first region, said second intensity being related to said thickness of the resist layer in said second region, so that when developed said resist layer has a uniform height over said first and second regions.

8. A process according to claim 7, said exposing step exposing said first and second regions so that said resist overlying said second region is removed and said resist overlying said first region is removed at least to the tops of the multiple deep trenches.

9. The process according to claim 7, wherein said resist is a positive resist, said first intensity being proportionally related to thickness of said resist layer in, and said second intensity being proportionally related to thickness of said resist layer in said second region.

10. The process according to claim 7, wherein said resist is a negative resist, said mask being inversely related to thickness of said resist layer in said first region, and said second intensity being inversely related to thickness of said resist layer in said second region.

11. A process for planarizing a surface of a semiconductor wafer which includes a first region with multiple deep trenches and a second region apart from said first region, said process including the steps of:

coating said wafer with a resist layer whose thickness is greater over said second region than over said first region;

aligning a mask with the resist layer, the mask having a variable density pattern having densities related to said thicknesses of the resist layer in said first and second regions; and exposing said first region with radiation of a first intensity and exposing said second region with radiation of a second intensity through the variable density pattern mask, so that when developed said resist layer has a uniform height over said first and second regions.

12. The process according to claim 11, wherein in said exposing step the process further comprises exposing said first and second regions so that said resist overlying said second region is removed and said resist overlying said first region is removed at least to the tops of the multiple deep trenches.

13. The process according to claim 11, wherein said resist is a positive resist and said pattern densities are arranged to directly relate to said resist layer thicknesses.

14. The process according to claim 11 wherein said resist is a negative resist and said pattern densities are arranged to inversely relate to said resist layer thicknesses.

* * * * *

UNITED STATES PATENT AND TRADEMARK OFFICE
CERTIFICATE OF CORRECTION

PATENT NO.    : 6,440,644 B1
DATED         : August 27, 2002
INVENTOR(S)   : Takashi Sato et al.

It is certified that error appears in the above-identified patent and that said Letters Patent is hereby corrected as shown below:

<u>Title page,</u>
Item [62], Related U.S. Application Data, after "6,064,466" the phrase
-- , which is a continuation of application No. 08/514,816, filed on Aug. 14, 1995 -- has been inserted.

<u>Column 6,</u>
Line 60, after "resist layer in" the phrase -- said first region -- has been inserted,
Line 64, "mask" has been replaced with -- first intensity --.

Signed and Sealed this

Eighteenth Day of March, 2003

JAMES E. ROGAN
*Director of the United States Patent and Trademark Office*